US006515862B1

(12) United States Patent
Wong et al.

(10) Patent No.: US 6,515,862 B1
(45) Date of Patent: Feb. 4, 2003

(54) HEAT SINK ASSEMBLY FOR AN INTEGRATED CIRCUIT

(75) Inventors: Thomas J. Wong, Seattle, WA (US); Ketan R. Shah, Tumwater, WA (US); Joseph S. Alina, Poulsbo, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/539,825

(22) Filed: Mar. 31, 2000

(Under 37 CFR 1.47)

(51) Int. Cl.[7] ................................................. H05K 7/20
(52) U.S. Cl. ..................... 361/710; 361/687; 361/695; 361/704; 257/713; 165/121; 454/184
(58) Field of Search ............................... 361/702–707, 361/710, 714–717, 720, 726–727, 719, 749, 687, 695, 692; 165/80.3, 80.4, 165, 185, 104.32, 104.33, 104.34; 174/16.1, 16.3, 52.4; 257/706–727, 730, 796; 24/458, 457

(56) References Cited

U.S. PATENT DOCUMENTS

| 5,884,692 A | * | 3/1999 | Lee et al. ................... 165/80.3 |
| 5,946,190 A | * | 8/1999 | Patel et al. .................. 361/700 |
| 5,973,921 A | * | 10/1999 | Lin .............................. 361/695 |
| 5,982,622 A | * | 11/1999 | Chiou ......................... 361/704 |
| 6,009,938 A | * | 1/2000 | Smith et al. ................. 165/185 |
| 6,043,984 A | * | 3/2000 | Tseng .......................... 361/704 |
| 6,046,906 A | * | 4/2000 | Tseng .......................... 361/704 |
| 6,101,096 A | * | 8/2000 | Macgregor et al. .......... 361/720 |
| 6,104,609 A | * | 8/2000 | Chen ........................... 361/695 |
| 6,109,341 A | * | 8/2000 | Kodaira et al. ............. 165/80.3 |
| 6,154,365 A | * | 11/2000 | Pollard et al. ............... 361/704 |
| 6,243,266 B1 | * | 6/2001 | Lo ............................... 361/704 |

FOREIGN PATENT DOCUMENTS

| JP | 2000228473 A | * | 8/2000 | ............ H01L/23/40 |
| JP | 2000349473 A | * | 12/2000 | ............ H05K/7/20 |
| JP | 2001057491 A | * | 2/2001 | ............ H05K/7/20 |
| JP | 2001156226 A | * | 6/2001 | ............ H01L/23/36 |

* cited by examiner

*Primary Examiner*—Lynn D. Feild
*Assistant Examiner*—Michael Datskovsky
(74) *Attorney, Agent, or Firm*—Schwegman, Lundberg, Woessner & Kluth, P.A.

(57) ABSTRACT

A heat sink for a microprocessor includes a thermally conductive base having a plurality of substantially parallel, arcuate fin structures extending outwardly in a vertical direction from the thermally conductive base. The plurality of substantially parallel fin structures have a high fin density to enhance heat dissipation from the heat sink. In one embodiment, a shroud encloses the fin structures and is attached to the thermally conductive base via latches that fit into a pair of grooves in the bottom surface of the thermally conductive base. A fan is attached to the shroud to direct a convection medium through the plurality of substantially parallel fin structures. Also described is a method of fabricating a heat sink assembly.

21 Claims, 4 Drawing Sheets

HEAT SINK ASSEMBLY FOR AN INTEGRATED CIRCUIT

TECHNICAL FIELD

Embodiments of the present invention relate generally to a heat dissipation device for an integrated circuit assembly and, more particularly, to a structure of a heat sink.

BACKGROUND

Microprocessors and other related computer components are becoming more and more powerful with increasing capabilities, resulting in increasing amounts of heat generated from these components. Packaged units and integrated circuit die sizes of these components are decreasing or remaining the same, which increases the amount of heat energy given off by these components for a given unit of surface area. Furthermore, as computer related equipment becomes more powerful, more and more components are being placed inside the equipment which is also decreasing in size, resulting in additional heat generation in a smaller volume of space. Increased temperatures can potentially damage the components of the equipment, or reduce the lifetime of the individual components and the equipment. Therefore, large amounts of heat produced by many such integrated circuits must be dissipated, and therefore must be accounted for in designing the integrated circuit mounting and packaging devices.

In current packaging techniques, heat sinks are often applied to the side of microprocessors opposite the side from which the electrical pin connections are mounted to dissipate heat from the microprocessors. The overall size of the heat sinks is limited by the volume constraints of the housing. Also the current manufacturing techniques generally limit fin density to less than 2.5 fins per centimeter, and an aspect ratio of fins (fin height to fin thickness) to less than 12. To improve the amount of heat dissipated from the heat producing components, there is a need to increase a heat dissipation convection surface area of the heat sinks without increasing the volume of the heat sinks.

For the reasons stated above, and for other reasons stated below which will become apparent to those skilled in the art upon reading and understanding the present specification, there is a need to increase the heat dissipation convection surface area for a given volume of heat sink.

BRIEF DESCRIPTION OF THE DRAWINGS

In the drawings, like numerals describe substantially similar components throughout the several views. Like numerals having different letter suffixes represent different instances of substantially similar components.

DETAILED DESCRIPTION

Figure 1:
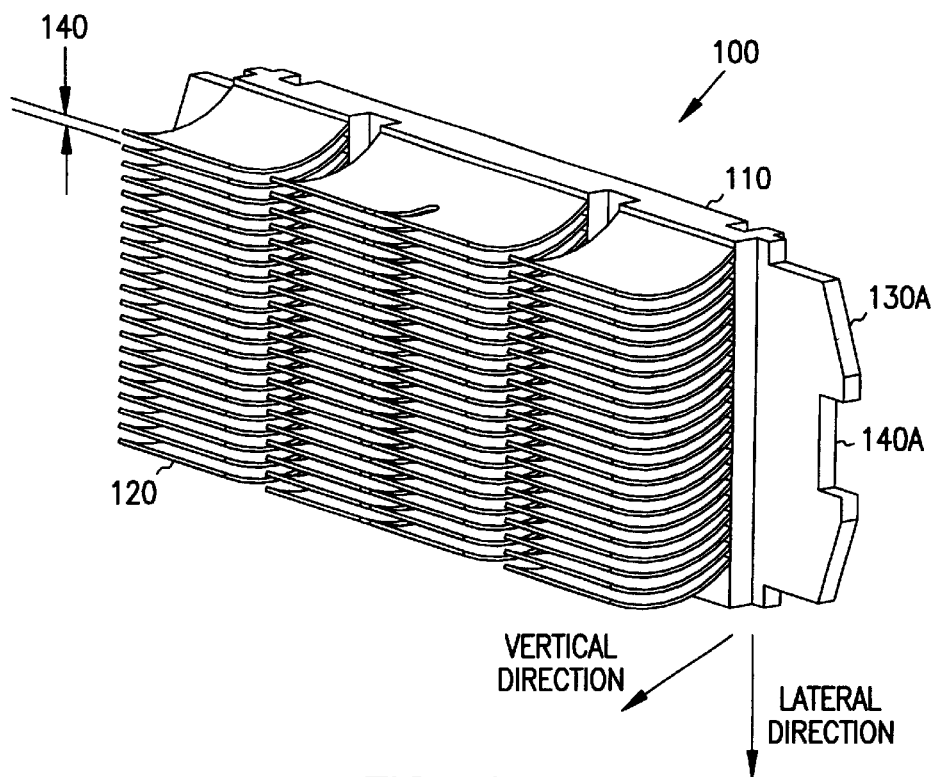
FIG. 1 is a perspective view of one embodiment of the present invention showing generally the heat sink.

In the following detailed description, reference is made to the accompanying drawings which form a part hereof, and in which is shown by way of illustration specific embodiments in which embodiments of the invention may be practiced. These embodiments are described in sufficient detail to enable those skilled in the art to practice such embodiments of the invention, and it is to be understood that the embodiments may be combined, or that other embodiments may be utilized and that structural, logical and electrical changes may be made without departing from the spirit and scope of the present disclosure. The following detailed description is, therefore, not to be taken in a limiting sense, and the scope of embodiments of the present invention is defined by the appended claims and their equivalents. In the drawings, like numerals describe substantially similar components throughout the several views. Like numerals having different letter suffixes represent different instances of substantially similar components. In the drawings, like numerals describe substantially similar components throughout the several views. Like numerals having different letter suffixes represent different instances of substantially similar components.

In this document the term "fin density" is understood as the number of fins per centimeter in a lateral direction of a heat sink having a plurality of substantially parallel fin structures. Similarly, the term "fin aspect ratio" is understood to refer to a ratio of a fin height to fin thickness. Also in this document the term "fin pitch" is understood to refer to a distance between centers of two adjacent fins.

This document describes, among other things, a heat sink having a high fin density (high ratio of surface area to volume), produced using a skive technology, to increase a convection surface area for a given volume of the heat sink. The skive technology consists of repeatedly shaving an extruded aluminum block to produce a plurality of substantially parallel fin structures extending outwardly from a thermally conductive base, and the plurality of fin structures having a fin density of greater than 2.5 fins per centimeter in the lateral direction to increase a convection surface area of the heat sink for a given volume of the heat sink. Unlike the conventional technology, the skive technology produces the plurality of fin structures that are integrally formed with the thermally conductive base. There are no joints or thermal interfaces between the plurality of fin structures and the thermally conductive base. The skive technique generally uses two machines to produce the plurality of fin structures having the high fin density in the heat sink. The first machine is used for clamping and guiding a long piece of extruded aluminum into a second machine. The second machine has an actuator that actuates up and down with a cutting die on a cam roller, to repeatedly shave the extruded aluminum block, to produce the plurality of fin structures having the high fin density in the heat sink.

FIG. 1 is a perspective view illustrating generally, by way of example, but not by way of limitation, one embodiment of a heat sink 100 according to the present disclosure. The heat sink 100 includes a plurality of substantially parallel fin structures 120 extending outwardly in a vertical direction from a thermally conductive base 110. In one embodiment the plurality of substantially parallel fin structures 120 have a fin density of about 2.5 to 5.5 fins per centimeter in a lateral direction on the thermally conductive base. In this embodiment the plurality of substantially parallel fin structures 120 have an aspect ratio of greater than or equal to 12, a fin thickness of about 0.04 to 0.06 centimeter, and a fin pitch of about 0.19 to 0.26 centimeter. Also in this embodiment the plurality of substantially parallel fin structures have a predetermined gap 140 of about 0.14 to 0.16 centimeter between adjacent fin structures. In one embodiment the plurality of substantially parallel fin structures 120 extend outwardly having an arcuate cross-section shape in the vertical direction. In one embodiment the heat sink 100 has feet 130A and 130B extending outwardly and orthogonally to the lateral direction, and they are disposed across from each other on the thermally conductive base 110 of the heat sink 100. Also in this embodiment the feet 130A and 130B have notches 140A and 140B, respectively. In one embodiment the heat sink is made of aluminum.

Figure 2:
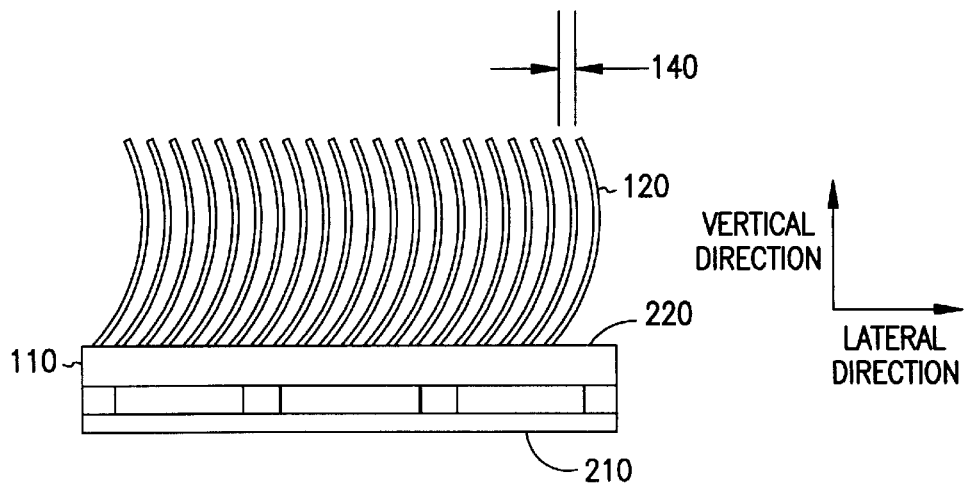
FIG. 2 is a side view of one embodiment of the present invention showing generally the thermally conductive base and the plurality of fin structure.

FIG. 2 is a side view illustrating generally, by way of example, but not by way of limitation, one embodiment of the plurality of substantially parallel fin structures 120 extending outwardly from a top surface 220 of the thermally conductive base 110 having an arcuate cross section shape in a vertical direction. The cross-section shape of the plurality of substantially parallel fin structures 120 can be any other shape suitable for enhancing the heat dissipation from the heat sink 100. Also in this embodiment the plurality of substantially parallel fin structures 120 have a predetermined gap 140 between adjacent fin structures. Also shown in this embodiment is a bottom surface 210 of the thermally conductive base 110, which is located across from the top surface 220.

Figure 3:
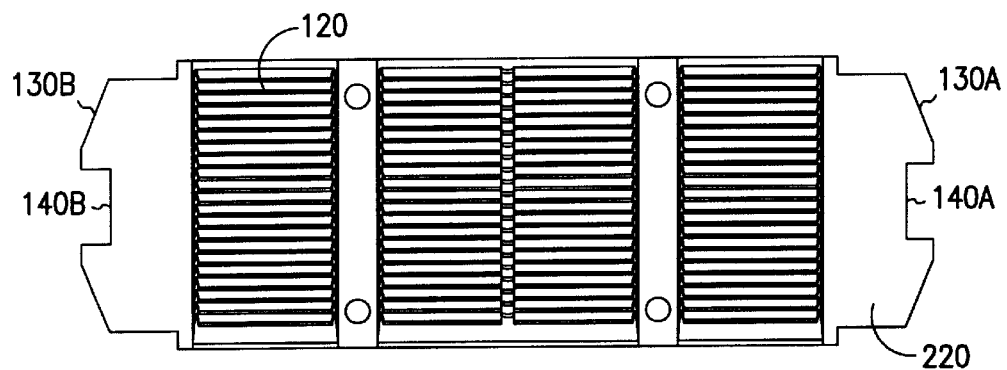
FIG. 3 is a top view of one embodiment of the present invention.

FIG. 3 is a top view illustrating generally, by way of example, but not by way of limitation, one embodiment of the heat sink 100 having notches 140A and 140B on the feet 130A and 130B, respectively. In this embodiment the notches 140A and 140B are rectangular in shape, and they are designed to receive a latch of a retention mechanism.

Figure 4:
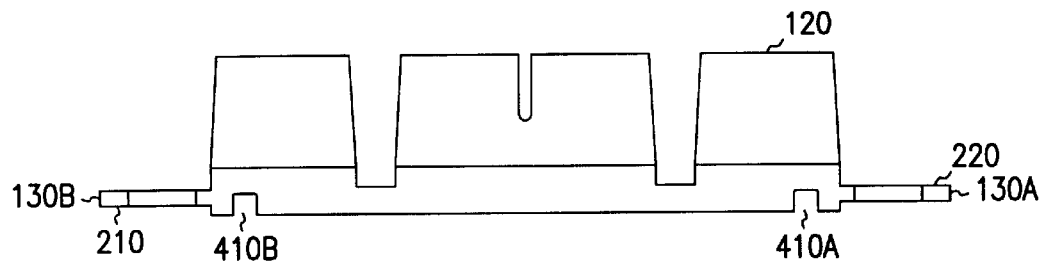
FIG. 4 is a front view of one embodiment of the present invention.

FIG. 4 is a front view illustrating generally, by way of example, but not by way of limitation, one embodiment of the heat sink 100 having grooves 410A and 410B on the bottom surface 210 of the thermally conductive base 110. In this embodiment the grooves 410A and 410B are rectangular in shape to receive latches 540A and 54B (FIG. 6), respectively, of a shroud, and they are located near the feet 130A and 130B, respectively.

Figure 5:
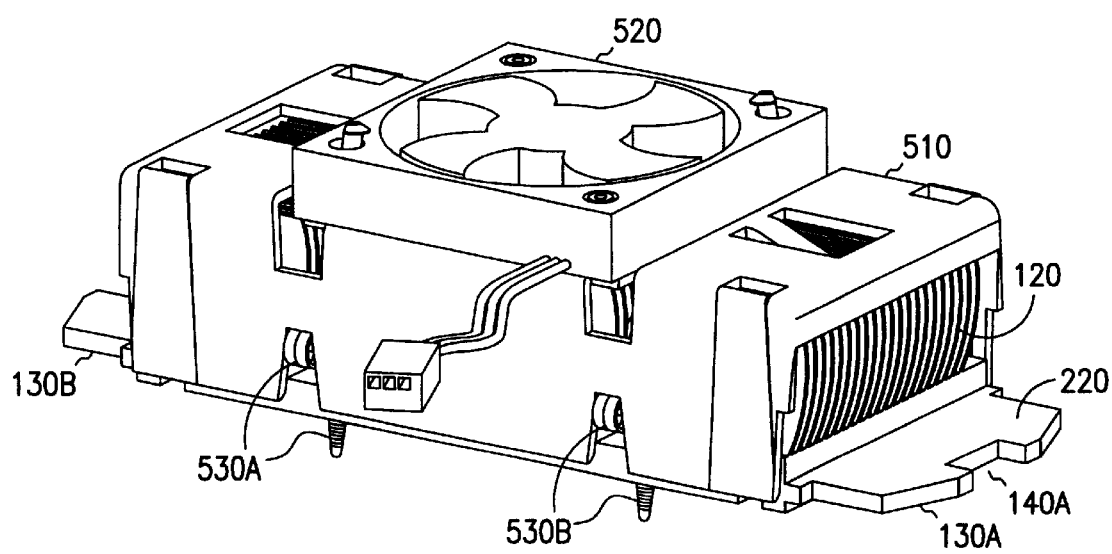
FIG. 5 is a perspective view of one embodiment of the present invention showing generally the mounting of a fan and a shroud to the heat sink.

FIG. 5 is a perspective view illustrating generally, by way of example, but not by way of limitation, one embodiment of the heat sink 100 enclosed in a shroud 510 using a pair of latches 530A and 530B. Also shown in this embodiment is a fan 520 attached to the shroud 510 to introduce a convection medium between adjacent fin structures.

Figure 6:
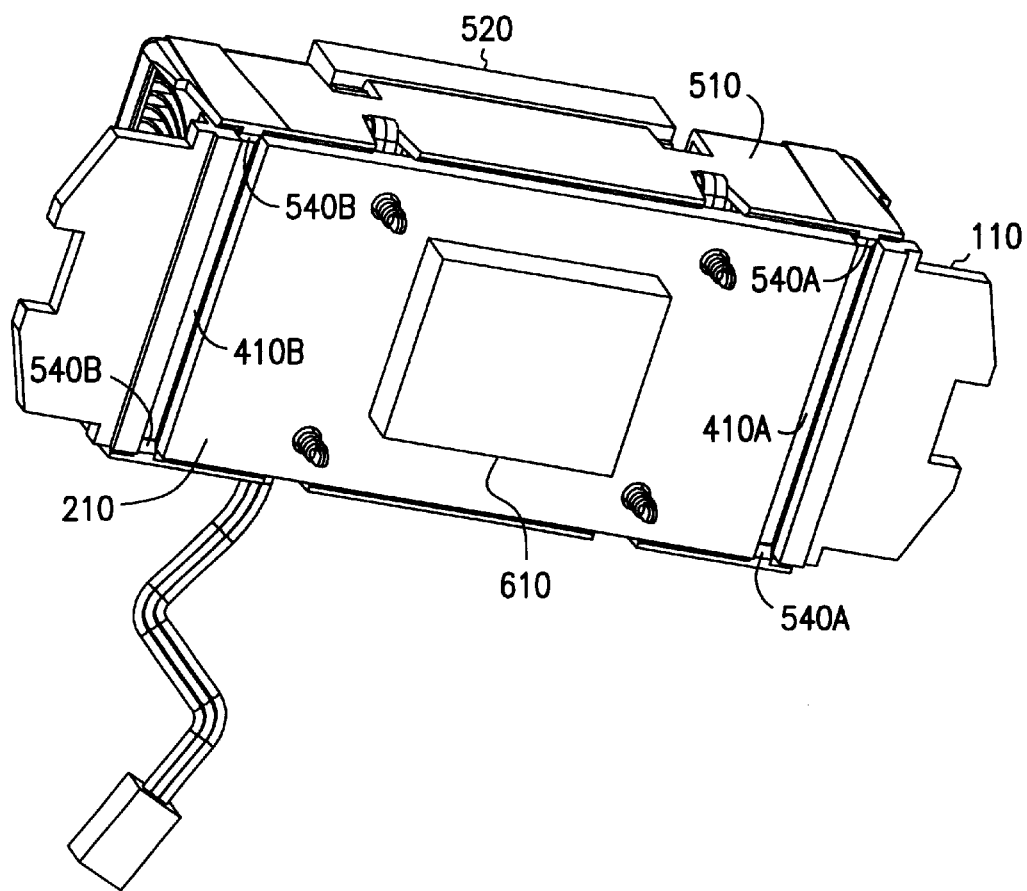
FIG. 6 is a perspective view of one embodiment of the present invention showing generally the mounting of a shroud, a fan, and a microprocessor to the heat sink.

FIG. 6 is a perspective view illustrating generally, by way of example, but not by way of limitation, one embodiment of the heat sink 100 attached to a microprocessor 610. In one embodiment the microprocessor is disposed opposite the side of the fan 520. In one embodiment the microprocessor 610 is thermally coupled to a bottom surface 210 of the thermally conductive base 110. In another embodiment a thermally conductive interface material is included between the microprocessor 610 and the bottom surface 210 of the thermally conductive base 110. Also seen in FIG. 6 are heat sink grooves 410A and 410B, which receive a pair of shroud latches 540A and a pair of shroud latches 540B, respectively.

Conclusion

The above described heat sink provides, among other things, an enhanced heat dissipation from a microprocessor. The enhanced heat dissipation is accomplished by having a high fin density to increase a convection surface area of the heat sink for a given volume of the heat sink.

It is to be understood that the above description is intended to be illustrative, and not restrictive. Many other embodiments will be apparent to those of skill in the art upon reviewing the above description. The scope of embodiments of the invention should, therefore, be determined with reference to the appended claims, along with the full scope of equivalents to which such claims are entitled.

What is claimed is:

1. A heat sink assembly comprising:
   a thermally conductive base having a top surface and a bottom surface;
   a plurality of substantially parallel fin structures extending outwardly from the top surface of the thermally conductive base,
   wherein the thermally conductive base further has at least two grooves in the bottom surface;
   a shroud enclosing the substantially parallel fin structures and attached to the thermally conductive base via latches that fit in the at least two grooves; and
   a fan attached to the shroud to introduce a convection medium between the plurality of substantially parallel fin structures, wherein the shroud directs the introduced convection medium through the plurality of substantially parallel fin structures.

2. The heat sink assembly of claim 1, wherein each of the plurality of substantially parallel fin structures has a fin aspect ratio of greater than or equal to 12.

3. The heat sink assembly of claim 1, wherein the plurality of substantially parallel fin structures have a predetermined gap in the range of 0.14 to 0.16 centimeter between adjacent fin structures, and wherein the plurality of substantially parallel fin structures have a fin pitch in the range of 0.19 to 0.26 centimeter.

4. The heat sink assembly of claim 1, wherein the plurality of substantially parallel fin structures have a thickness in the range of 0.04 to 0.06 centimeter.

5. The heat sink assembly of claim 1, wherein the plurality of substantially parallel fin structures comprise aluminum.

6. The heat sink assembly of claim 5, wherein the plurality of substantially parallel fin structures extend outwardly having an arcuate cross section shape in the vertical direction.

7. The heat sink assembly of claim 1, wherein the thermally conductive base having a bottom surface, wherein the bottom surface is opposite side of the plurality of substantially parallel fin structures, and wherein the base further having a pair of grooves on the bottom surface to receive a latch of a shroud.

8. The heat sink assembly of claim 1, further includes a microprocessor thermally coupled to the bottom surface of the thermally conductive base.

9. The heat sink assembly of claim 8, further includes a layer of thermally conductive interface material between the microprocessor and the bottom surface of the heat sink.

10. The heat sink of claim 8, wherein the fan size is at least 5 centimeters in diameter.

11. The heat sink assembly of claim 1, wherein the plurality of substantially parallel fin structures have a fin density in the range of 2.5 to 5.5 fins per centimeter in a lateral direction on the thermally conductive base.

12. The heat sink assembly of claim 1, wherein the thermally conductive base further comprises feet, wherein the feet extend outwardly from the base, and wherein the feet are across from each other.

13. A method comprising:
   providing a heat sink having a plurality of substantially parallel fins extending outwardly from a top surface of a thermally conductive base, wherein the thermally conductive base has at least two grooves in a bottom surface thereof;

covering the fins in a shroud by latching the shroud to the grooves;

fastening a fan to the shroud such that the fan can introduce a convection medium between the fins; and attaching an integrated circuit to the bottom surface of the thermally conductive base to dissipate heat from the integrated circuit.

14. The method of claim 13 wherein attaching comprises thermally coupling the bottom surface of the thermally conductive base to the integrated circuit.

15. The method of claim 13 wherein in providing, the plurality of substantially parallel fins each has a thickness in the range of 0.04 to 0.06 centimeter.

16. The method of claim 13 wherein in providing, the plurality of substantially parallel fins each has a fin pitch in the range of 0.19 to 0.26 centimeter.

17. The method of claim 13 wherein in providing, the plurality of substantially parallel fins each has an arcuate cross section shape in a vertical direction.

18. The method of claim 13 wherein, in providing, the plurality of substantially parallel fins have a fin density in the range of 2.5 to 5.5 fins per centimeter in a lateral direction.

19. The method of claim 13 wherein, in providing, the plurality of substantially parallel fins have a predetermined gap between adjacent fins in the range of 0.14 to 0.16 centimeter.

20. The method of claim 13 wherein, in providing, the plurality of substantially parallel fins each have an aspect ratio greater than or equal to 12.

21. The method of claim 13 wherein, in covering, a pair of shroud latches fits into each groove in the bottom surface of the thermally conductive base.

* * * * *

UNITED STATES PATENT AND TRADEMARK OFFICE
CERTIFICATE OF CORRECTION

PATENT NO. : 6,515,862 B1
DATED : February 4, 2003
INVENTOR(S) : Ketan R. Shah, Joseph S. Alina and Thomas J. Wong It is certified that error appears in the above-identified patent and that said Letters Patent is hereby corrected as shown below:

Column 2,
Lines 19-24, delete the following:
"In the drawings, like numerals describe substantially similar components throughout the several views. Like numerals having different letter suffixes represent different instances of substantially similar components."

Column 3,
Line 40, delete "54B" before "(FIG. 6)" and insert -- 540B -- therefor.

Signed and Sealed this

Twenty-seventh Day of July, 2004

JON W. DUDAS
*Acting Director of the United States Patent and Trademark Office*